(12) United States Patent
King et al.

(10) Patent No.: US 11,973,093 B2
(45) Date of Patent: Apr. 30, 2024

(54) VISIBLE-TO-LONGWAVE INFRARED SINGLE PHOTON AVALANCHE PHOTODETECTOR ON SILICON

(71) Applicant: SEMIKING LLC, Gloucester, MA (US)

(72) Inventors: Clifford Alan King, Gloucester, MA (US); Anders Ingvar Aberg, Staffanstorp (SE)

(73) Assignee: SEMIKING LLC, Gloucester, MA (US)

( * ) Notice: Subject to any disclaimer, the term of this patent is extended or adjusted under 35 U.S.C. 154(b) by 415 days.

(21) Appl. No.: 17/336,423

(22) Filed: Jun. 2, 2021

(65) Prior Publication Data

US 2021/0343762 A1 Nov. 4, 2021

Related U.S. Application Data

(63) Continuation-in-part of application No. 17/244,135, filed on Apr. 29, 2021.

(60) Provisional application No. 63/117,631, filed on Nov. 24, 2020, provisional application No. 63/033,315, filed on Jun. 2, 2020, provisional application No. 63/017,292, filed on Apr. 29, 2020.

(51) Int. Cl.
| | |
|---|---|
| *H01L 27/146* | (2006.01) |
| *H01L 31/0312* | (2006.01) |
| *H01L 31/107* | (2006.01) |

(52) U.S. Cl.
CPC .... *H01L 27/1461* (2013.01); *H01L 27/14603* (2013.01); *H01L 27/14623* (2013.01); *H01L 27/14643* (2013.01); *H01L 31/0312* (2013.01); *H01L 31/107* (2013.01)

(58) Field of Classification Search
CPC .......... H01L 27/1461; H01L 27/14603; H01L 27/14623; H01L 27/14643; H01L 31/0312; H01L 31/107
USPC ....................................................... 257/435
See application file for complete search history.

(56) References Cited

U.S. PATENT DOCUMENTS 10,985,201 B2 * 4/2021 Sze ................... H01L 27/14603

\* cited by examiner

*Primary Examiner* — Tu-Tu V Ho
(74) *Attorney, Agent, or Firm* — Sunstein LLP

(57) ABSTRACT

A single photon avalanche (SPAD) device configured to detect visible to infrared light includes a substrate and a trench coupled to the substrate. The trench has a lattice mismatch with the substrate and has a height equal to or greater than its width. The device further includes a substantially defect-free semiconductor region that includes photosensitive material. The semiconductor region includes a well coupled to the trench and doped a first type. The well is configured to detect a photon and generate a current. The semiconductor region also includes a region formed in the well and doped a second type opposite to the first type. The well is configured to cause an avalanche multiplication of the current. The trench and the well form a first electrode and the region forms a second electrode.

20 Claims, 9 Drawing Sheets

VISIBLE-TO-LONGWAVE INFRARED SINGLE PHOTON AVALANCHE PHOTODETECTOR ON SILICON

CROSS REFERENCE TO RELATED APPLICATIONS

The present application is a continuation-in-part of U.S. patent application Ser. No. 17/244,135 filed Apr. 29, 2021, which claims the benefit of U.S. Provisional Patent Application No. 63/017,292 filed Apr. 29, 2020, U.S. Provisional Patent Application No. 63/033,315 filed Jun. 2, 2020, and U.S. Provisional Patent Application No. 63/117,631 filed Nov. 24, 2020, the disclosures of which are incorporated by reference herein in their entirety.

BACKGROUND OF THE INVENTION

Field of the Invention

This invention relates to a single photon avalanche photodetector fabricated on a silicon wafer that is sensitive from the visible to longwave infrared spectral regions.

Discussion of the Related Art

Image sensors capable of creating images in the infrared spectral region are important in a wide variety of applications including fiber optic communications, light detection and ranging (LiDAR), fluorescence lifetime imaging microscopy (FLIM), silicon integrated circuit manufacturing, infrared microscopy, solar cell manufacturing, imaging through smoke and fog, night vision for security, night vision for military uses, imaging military laser target designators, art conservation, astronomy, pollution detection, and infrared spectroscopy. Medical applications including cancer detection, pharmaceutical manufacturing, coronary surgery, and the early detection of dental caries also benefit from images created using shortwave infrared illumination (SWIR). Midwave infrared (MWIR) and longwave infrared (LWIR) imaging are especially important for military imaging applications due to their ability to penetrate degraded visual battlefield environments.

In particular, LiDAR is applicable for robo-taxis, autonomous trucks, and advanced driver-assistance systems (ADAS) to aid in the safe navigation of commercial and consumer vehicles. Current systems use near infrared (NIR) wavelengths (750-1100 nm) or SWIR wavelengths (1100-2500 nm) to gather time-of-flight information from probing laser illumination. The human eye can focus visible light and infrared light with a wavelength less than about 1400 nm on the retina. This ability to focus poses an inherent danger to human sight if the laser illumination levels used in the LiDAR system exceed the maximum permissible exposure (MPE). To remain "eye safe," power from an NIR laser at 905 nm must be limited by a factor $10^5$ to $10^6$ compared to SWIR laser illumination with a wavelength above 1400 nm at pulse widths between 1 ns and 1 μs. Direct detection time-of-flight (dTOF) LiDAR systems usually use a narrow pulse width between 0.1 and 100 ns to preserve measured range accuracy and dynamic range. The ability to use a safe higher power laser illumination source increases the range performance of the LiDAR system given equally capable receivers. In addition, LiDAR for use in outdoor conditions needs to contend with noise from solar radiation which can be mistaken for a laser return. The irradiance of solar radiation at 1540 nm is only 59 percent of the value at 905 nm yielding another important advantage for using illumination sources above 1400 nm. Illumination in the shortwave infrared above 1400 nm allows eye safety at higher power levels and lower ambient noise from the sun. An inexpensive image sensor capable of viewing such an illumination source is of great value to LiDAR systems for vehicular applications.

A typical image sensor comprises a two-dimensional array of picture elements (pixels) consisting of photodetectors, transistors, capacitors, and metal interconnects. The photodetectors in each pixel sense the incoming radiation and convert the incident photons into electrons. The accompanying electrical components in each pixel (i.e. transistors) quantitatively evaluate the intensity of the incoming radiation and output proportional electrical values to downstream circuitry which combines the pixels to form an image. In the case of a single photon avalanche photodetector (SPAD), a digital signal is sent to the downstream circuitry indicating the detection of an incoming photon.

Two-dimensional photodiode arrays, or focal plane arrays (FPAs) as they are known to practitioners in the infrared imaging field require separate semiconductor chips to form an image sensor. In these devices, each pixel within the FPA is mated via an indium bump bond to a connection on a silicon read-out integrated circuit (ROIC). The ROIC contains the necessary circuitry to accept the photodetector signal and render an image. For most infrared imagers, this bump bonding requirement comes about because today's photodetectors use compound semiconductor materials such as InGaAs, InSb, and HgCdTe that are largely incompatible with silicon processing. The resultant hybrid image sensor formed by this bonding process exhibits problems with reliability, semiconductor manufacturing yield, chip size, and most importantly high cost. The size of the indium bump itself limits pixel dimensions thus electronic innovations accomplished in related fields such as CMOS scaling cannot be used to their fullest extent. Hybrid bonding using copper pads partially alleviates the pixel dimension problem, but individual chips still must be bonded to the ROIC wafer. Therefore, the hybrid approach is preferentially replaced by a silicon chip where these concerns are minimized or eliminated.

Germanium has a 4 percent lattice mismatch to silicon rendering a highly defective layer when epitaxially grown directly on silicon. Minority carrier p-n junction devices fabricated in this Ge material possesses very high dark current and thus high noise. The high noise of these devices makes them useless for photon starved applications like low light imaging and high performance LiDAR. To address these important applications at low cost, a method to produce high quality Ge-on-Si was developed by Noble Peak Vision Corp.

A single silicon chip visible-to-shortwave infrared image sensor using nearly defect free germanium is described in papers such as those by Ackland, et al. and Aberg, et al. The photodiode process used in these publications whereby a photosensitive material in the visible-to-shortwave spectral region is epitaxially grown on a silicon substrate is further described in U.S. Pat. Nos. 7,012,314 and 7,297,569. The process described in these works uses selective epitaxial growth to form nearly defect free semiconductor regions on the silicon substrate after the components of the ROIC are already in place. The patents describe an exemplary process using single crystal germanium as the photosensitive material. U.S. Pat. No. 7,453,129 describes how an array of such integrated elements can be combined to form an image sensor.

The photodiode element of the germanium image sensor described above consists of a p-n junction biased with a small reverse voltage to limit the dark current which adds noise to the collected signal current. The signal current created by the incident radiation is integrated during a video frame time and manifested as charge collected on the photodiode. The magnitude of the charge is proportional to the signal incident upon the junction, but it also contains the integrated dark current which degrades the signal-to-noise ratio.

Crystalline semiconducting alloys of SiGeSn and GeSn may also be grown on Ge buffer layers produced directly on Si substrates. These alloys have decreasing bandgaps depending on the Sn mole fraction making them useful for SWIR, MWIR, and LWIR imaging applications. In addition, at a critical Sn mole fraction, the alloy bandgap becomes direct opening the possibility of a semiconductor laser on Si. To date these materials use a heavily defective Ge buffer layer on Si, the resulting quality of the subsequently grown SiGeSn and GeSn layers are also heavily defective and not useful for device applications where low reverse (dark) current is essential. However, using the low defect density process developed by Noble Peak Vision Corp. referenced above, one skilled in the art of epitaxial growth can produce high quality layers of SiGeSn and GeSn. The addition of these materials to the silicon device arsenal allows image sensors functioning at longer wavelengths to be fabricated directly on silicon substrates.

While a simple photodetector using these nearly defect free semiconductor regions yields low dark current, it does not have enough sensitivity for long range LiDAR applications. Therefore, to improve the sensitivity of a p-n junction, the photodetector may be operated in avalanche mode whereby electronic gain is realized by the creation of many electron-hole pairs through impact ionization. Furthermore, the device may be operated in single photon or "Geiger" mode where it is biased beyond the breakdown voltage allowing the absorption of a single photon to initiate avalanche multiplication and create a large current. The optimum device structure for single photon detection deviates substantially from the form used for standard imaging applications. The equivalent performance parameter of dark current for a SPAD device is the dark current rate (DCR) expressed in Hz which characterizes the rate electron-hole pairs are generated in the depletion region of the p-n junction and originate an avalanche multiplication event. Likewise, the equivalent performance parameter for quantum efficiency is the probability of detection efficiency (PDE) which accounts for the both the absorption of an incoming photon to create an electron-hole pair as well as the initiation of an avalanche multiplication event.

Several device structure elements are necessarily optimized for a high performance SPAD device to obtain a low DCR and high PDE. Silicon and compound semiconductor (III-V and II-VI) SPAD devices use circularly patterned device regions to prevent the formation of an isolated region of high electric field at a sharp edge and other techniques to prevent premature edge breakdown. These devices usually use a guard ring of relatively low doping around the periphery of the heavily doped p-type region to lower the magnitude of the electric field compared to the central heavily doped p-type region. Through use of the guard ring, impact ionization is better confined to the central region of the device thus increasing PDE and reducing timing jitter. A disadvantage of many guard ring designs is that the area requirement of the device is significantly larger than the central heavily doped p-type region area. This disadvantage may be particularly pronounced for higher voltage designs with overall lower doping levels. In addition, metallization is needed to connect to the well, causing optical shadowing effects for front-side illuminated devices employing common guard ring designs. For small pixel pitch devices, the disadvantages of a guard ring design becomes more severe, which has prompted work on vertical Si SPAD designs and Si SPAD designs with guard ring areas overlapping with dielectric isolation structures. Therefore, an intelligently designed device optimized for single photon detection to obtain low DCR, high PDE, and low jitter is needed for high performance LiDAR applications.

SUMMARY OF THE EMBODIMENTS

Embodiments of the present invention disclose device designs that achieve these goals for light detection in NIR and SWIR, including wavelengths above 1400 nm. The photodetector designs are useful for intensity and 3D imaging in the MWIR and LWIR spectral regions using smaller bandgap materials such as GeSn and SiGeSn.

The fabrication of a single photon avalanche photodetector (SPAD) begins with a conventional silicon complementary metal oxide semiconductor (CMOS) process and is interrupted after the formation of the first metal via. Using the process described in U.S. Pat. Nos. 7,012,314, 7,297, 569, and 7,453,129, all of which are incorporated by reference herein in their entirety, nearly dislocation free single crystal semiconducting isolated regions are formed through selective epitaxial growth and chemical mechanical polishing on the CMOS silicon wafer. The use of germanium in the referenced process is purely exemplary and should not be viewed as limiting. One could also use other materials such as alloys of germanium, e.g., $Si_{1-x-y}Ge_xSn_y$ and $Ge_{1-x}Sn_x$ to form the defect free semiconducting regions. Furthermore, the misfit dislocation free semiconductor regions can be used as a crystalline template to grow other combinations of semiconductor layers useful for device applications.

The structure with misfit dislocation free semiconducting regions uses a high aspect ratio trench. The high aspect ratio seed trench is formed on an n+ source/drain region contained within an n-well that serves as the cathode contact to the SPAD. The Ge seed epitaxial growth is in-situ doped with phosphorous to ensure electrical continuity to the n-well region. The n-well region extends within the substrate beyond the Ge region allowing it to be contacted with an n+ source/drain region and backend metallization as conventionally achieved to the CMOS transistors.

Three device structures are disclosed to produce a high performance SPAD in embodiments of the present invention. A fourth embodiment describes opaque elements added around the periphery of the device to prevent cross-talk between pixels. Two of the device structures differ in their placement of the heavily doped p-type region relative to the dielectric isolation. The third device employs a separate absorption and multiplication (SAM) structure using different materials for each region. To form the important doped regions of the Ge SPAD device, ion implantation and subsequent annealing of the resulting damage may be used as well known to those skilled in the art. To protect the sensitive semiconductor surface from contamination during photolithography and ion implantation steps, a thin screen oxide may be deposited on the single crystal Ge surface. Blanket phosphorous implants without any photolithographic patterning ensure the entire Ge region above the seed trench region is lightly doped n-type.

The first embodiment employs four p-type implants to form the SPAD anode to create a high fill factor device. To make this SPAD, two p-type blanket implants are performed without photolithographic patterning to span a region at the top of the device to all the dielectrically isolated edges. Next, two more p-type implants are performed with a circular or near-circular lithographically formed pattern centered within the single crystal grown region. These implants have a higher dose and extend deeper into the device than the previous implants and define a perimeter of the multiplication region of the device. The multiplication region of the device extends below the p-type implants into the semiconductor region. The p-n junction of this embodiment intersects with the oxide isolation sidewall defining the nearly defect free grown region. The electric field at the breakdown voltage is high in the central region and is immediately reduced at the edge of the p-type doped region defined by the second implant. Generation current emanating from the periphery of the device, including that generated from interface traps at the sidewall interface, do not contribute to the DCR substantially since they are directed vertically by the field and collected without multiplication.

A second SPAD device structure embodiment is disclosed where the p-n junction intersects with the dielectric on the top surface. The top Ge/oxide interface is more easily treated to minimize traps and demonstrates an overall lower dark current at the cost of a reduction in fill factor. In addition, due to placement of the p-n junction, both lateral and vertical electric fields act to divert dark generated carriers from entering the multiplication zone and thus lower the DCR. Unlike the embodiment already discussed, the first p-type implant in this structure acts as a conventional guard ring and is lithographically patterned with its edge displaced from the single crystal growth/oxide boundary by an amount depending on the doping levels and Ge region thickness. The second p-type implant is performed with a circularly patterned mask placed within the area of the first implant to define the avalanche multiplication region as in the first embodiment. N-type implants along the length of the single crystal grown perimeter region prevent depletion from negative charge that may be present at the Ge/oxide interface. Finally, to obtain an additional lever to control the semiconductor surface potential, a gate is placed above the guard ring to help minimize dark current generation and prevent premature breakdown along the device perimeter.

Once the ion implantation steps are completed, the screen oxide is chemically stripped with a dilute solution of hydrofluoric acid and replaced with a thin deposited oxide. A rapid thermal anneal (RTA) removes any damage to the crystalline structure of the Ge due to the ion implantation. When using Ge as the defect free region, a low temperature thermal oxidation with the deposited oxide in place is undertaken next to form a Ge/GeO$_2$ interface with a low trap density to minimize the DCR. Another deposited oxide serves to act as a thick dielectric to separate the SPAD from the subsequent metal contact. A contact window is lithographically fabricated and etched. To complete the device fabrication to metal 1, a conventional interlevel metallization process is executed to make contact to the cathode and anode of the SPAD.

A third embodiment of our invention is an avalanche photodiode structure that uses the dislocation free semiconducting region to form a multiplication zone and an epitaxial layer of a smaller bandgap material subsequently grown on top to serve as an absorptive layer. The resulting separate absorption and multiplication (SAM) structure permits the depletion region to exist primarily within the larger bandgap material thus reducing the reverse leakage current. The separate absorption layer decreases timing jitter since electron-hole pairs are created almost exclusively within that layer. This structure will also serve as a detecting element even if it is not biased into breakdown for certain epitaxial layer compositions as may be useful for MWIR and LWIR imaging.

Our SPAD design allows a high fill factor providing for a high PDE in the device. The SPAD designs according to our invention keep DCR low by making sure many surface generated dark carriers are collected in areas of the device with intentionally low impact ionization probabilities. At the same time, very thick depletion regions are possible in the design which will favor impact ionization over band-to-band tunneling. Thus, DCR mechanisms that are known to dominate many small area, low band gap SPADs are managed advantageously in our design.

In one embodiment of the present invention, a single photon avalanche (SPAD) device configured to detect visible to infrared light includes a substrate and a trench coupled to the substrate. The trench has a lattice mismatch with the substrate and has a height equal to or greater than its width. The device further includes a substantially defect-free semiconductor region that includes photosensitive material. The semiconductor region includes a well coupled to the trench and doped a first type, the well configured to detect a photon and generate a current. The semiconductor region also includes a region formed in the well and doped a second type opposite to the first type. The well is configured to cause an avalanche multiplication of the current. The trench and the well form a first electrode and the region forms a second electrode.

In some embodiments, the first type may be n-type and the second type may be p-type. The substrate may be a p-type silicon substrate and include an n-well region formed in the substrate, wherein the trench may be coupled to the n-well region. The trench may be formed on an n+ source/drain region contained within the n-well region. The substrate may be an n-type substrate. The height of the trench is at least 1.7 times the width of the trench. Dislocations in the trench may propagate to a side wall of the trench. The semiconductor region may have a band gap between about 0.08 eV and about 2.0 eV. The semiconductor region may have a band gap between about 0.08 eV and about 0.9 eV. The well and the trench may include germanium. The well and trench may include a germanium tin alloy. The trench may be epitaxially grown on the substrate and the lattice mismatch with the substrate may be greater than 0.2%. The device may further include one or more dielectric layers formed adjacent to the semiconductor region and may be configured to allow a height of the well to be increased. The device may further include an oxide sidewall along the semiconductor region wherein the oxide sidewall has an interface trap density below about $2 \times 10^{11}$ eV$^{-1}$ cm$^{-2}$ and a fixed charge density below about $2 \times 10^{11}$ cm$^{-2}$. The well may be configured to detect the photon having a wavelength between about 300 nm and about 15,000 nm. The well may be configured to detect the photon having a wavelength between about 900 nm and about 15,000 nm. The region may have a perimeter equal to or less than a perimeter of the well. The device may further include a guard ring spaced radially away from the perimeter of the region, the guard ring configured to modify an electric field profile outside the perimeter of the region. The region may include an alloy including germanium, wherein the alloy is $Si_{1-x}Ge_x$, $Si_{1-x-y}Ge_xSn_y$, or $Ge_{1-x}Sn_x$. The device may further include a plurality of opaque structures disposed around a perimeter of the semiconductor region, the opaque structures configured to block photons from entering or exiting the device.

BRIEF DESCRIPTION OF THE DRAWINGS

Embodiments of the present invention, together with its various features and advantages, can be readily understood from the following more detailed description taken in conjunction with the accompanying drawings, in which.

DETAILED DESCRIPTION OF THE INVENTION

Embodiments of the present invention disclose a single photon avalanche photodetector (SPAD) made using a semiconductor region integrated on a silicon wafer sensitive to infrared radiation with cutoff wavelengths up to about 15,000 nm. The exemplary device uses germanium as the semiconductor material and forms a single crystal region compatible with a conventional CMOS process using the method disclosed in U.S. Pat. Nos. 7,012,314 and 7,297,569 whereby nearly dislocation free semiconductor isolated regions are formed through selective epitaxial growth and chemical mechanical polishing. The use of germanium as an example should not be considered as limiting and many other crystalline semiconductors may be used, such as $Si_{1-x-y}Ge_xSn_y$ and $Ge_{1-x}Sn_x$ where $0 \leq x, y \leq 1$. If a CMOS or Bipolar-CMOS (BiCMOS) process is chosen as the core, both the CMOS and bipolar devices may be fabricated first. One skilled in the art of making CMOS and bipolar devices can readily complete the details for such an effort. Since a particular CMOS process is not central to embodiments of the present invention, the core CMOS process are not further described herein.

Figure 1:
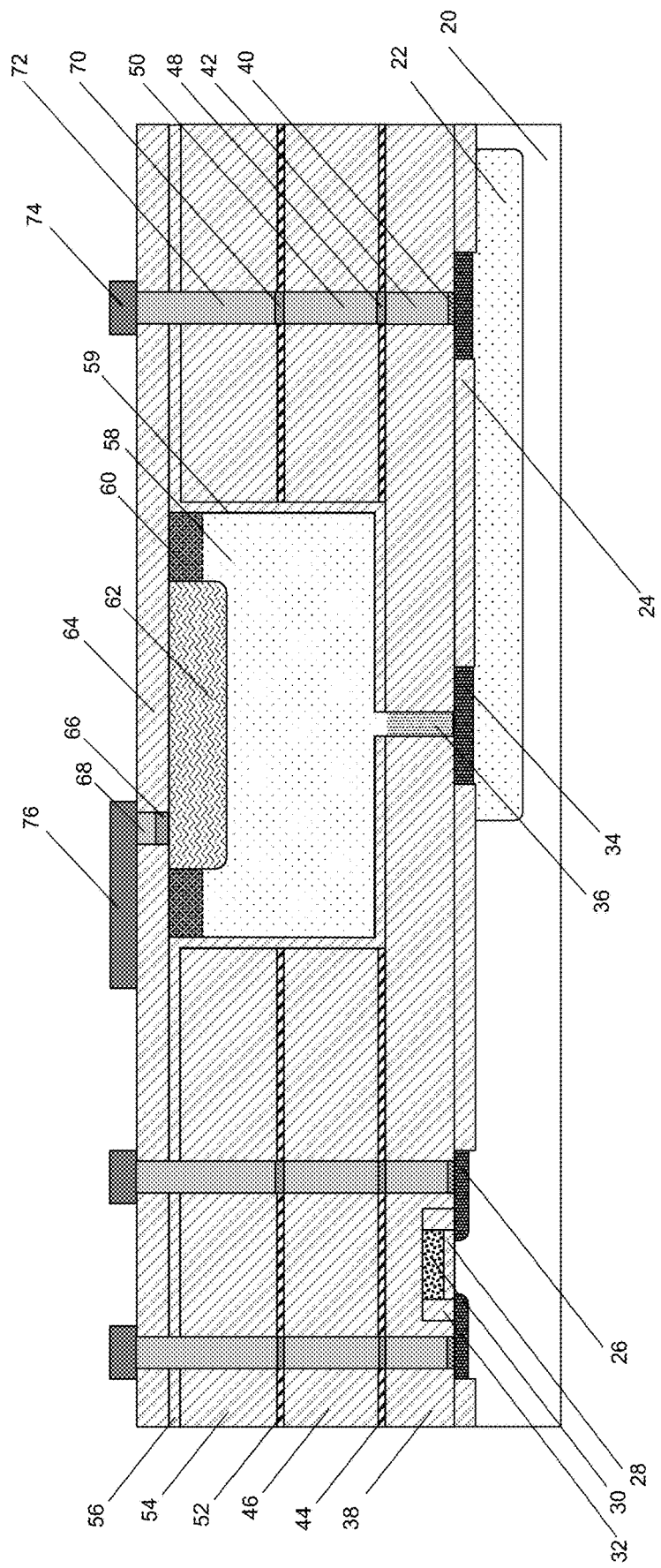
FIG. 1 is a schematic cross-sectional view of the completed SPAD device structure with a conventional MOS transistor according to embodiments of the present invention.

One embodiment of the SPAD device with co-integrated CMOS circuitry is shown in cross section view in FIG. 1. FIG. 1 includes a Si p-type doped substrate 20 in which many conventional CMOS regions such as n-well 22, shallow trench isolation 24, n+/p+ source/drain 26, gate oxide 28, polycrystalline Si gate 30, and gate oxide sidewall spacer 32 are formed. The n-well 22 is isolated from the p-type substrate 20 and connects to the cathode of the SPAD via the low resistivity n+ region 34 which is also formed in the Si. Metal silicide is used on the n+/p+ source/drain regions 26, but should not be used on the low resistivity n+ region 34 which in addition to being a low resistance layer also serves as a seeding layer for the epitaxial growth. Methods to selectively protect certain Si regions from silicide formation by use of sacrificial silicon nitride or silicon oxynitride layers are commonplace in industry and are not further described in detail herein. To promote single crystalline growth of Ge, such a silicon nitride or silicon oxynitride layer is employed to shield the n+ region 34 from silicidation, but since the layer is removed from the n+ region 34 prior to epitaxial growth, the layer is not shown in FIG. 1. Interlayer dielectric 38 is positioned above substrate 20 and all the elements formed in this substrate. An interface barrier metallization 40 and tungsten plug 42 connects to the various n+/p+ source/drain regions 26. All the components mentioned so far are found in the core CMOS process.

In the embodiment of the SPAD device according to FIG. 1, an etch-stop layer 44 which may contain silicon nitride or silicon oxynitride and a second interlayer dielectric layer 46 are deposited on top of the prior layers. An interface barrier metallization 48 and tungsten plug 50 are formed by common methods inside interlayer dielectric layer 46 in such a way that each interface barrier metallization 48 is placed in between the connecting tungsten plug 42 to tungsten plug 50 forming a low resistance serial connection. Thus, one purpose of the etch-stop layer 44 is to be able to precisely stop the etch process that is part of defining the tungsten plug 50. A second etch-stop layer 52 and a third interlayer dielectric layer 54 are formed on top of all the previously layers.

Prior to forming the topmost tungsten plug, the SPAD device is formed in Ge well 58 which is a single crystal semiconductor region recessed in a cavity in the interlayer dielectric layers 46 and 54. Thus, the thickness of the Ge well 58, which is an important parameter for the overall function of the SPAD, is defined precisely by the thickness of the interlayer dielectric layers 46 and 54. An advantage of the design is that the thickness and number of sequential interlayer dielectrics 46 and 54 and corresponding tungsten plugs can be adapted to the SPAD thickness requirement. Ge well 58 is separated from the other layers by liner 56 but is connected to the low resistivity n+ region 34 by an n-type doped Ge trench 36 which is preferably placed near the center of Ge well 58. The Ge well 58 is formed by using lithographic patterning and dry etching of the interlayer dielectric layers and etch stop layers to form the cavity and is later filled with Ge. Thus, a second purpose of the etch-stop layers 44 and 52 is to help in precisely controlling the thickness of the SPAD by acting as etch stop layers not only for tungsten plug formation processes but also for the formation of Ge well 58. Liner 56 is made of a deposited silicon dioxide which may be deposited, for example, by sub-atmospheric chemical vapor deposition (SACVD) or by other commonly practiced deposition methods. However, any material for the liner 56 that promotes high selectivity to Ge growth and provides acceptable interface properties to Ge is preferred. Liner 56 can also be composed of multiple materials deposited sequentially or formed at different times to separate the Ge from the interlayer dielectrics. A second lithographic step and dry etching defines the high aspect ratio trench 36, a type of process sequence often referred to as dual damascene in which a smaller cavity is formed inside a larger cavity. The Ge material is grown by selective epitaxy by first growing the in-situ n-type doped Ge trench 38 using either phosphorus or arsenic as the dopant source, although others may be used. The Ge well 58 is also grown by epitaxy but without any intentional doping. It is beneficial to use high purity gases for this process step as a very low background doping is desired, typically below about $1 \times 10^{16}$ cm$^{-3}$ or even better below about $1 \times 10^{15}$ cm$^{-3}$ in order to achieve the desired electrical field profile which helps optimize impact ionization over band-to-band tunneling. After growing the desired diameter of Ge required for Ge well 58, excess Ge material is removed by chemical mechanical polishing (CMP). The epitaxially grown Ge fills the Ge well 58 which results in a Ge sidewall 59 adhering to the shape defined by the dry etched cavity as shown in FIG. 1.

The sidewall 59 is important as it affords high controllability of the device diameter. It is also possible to under fill the entire etched cavity with material resulting in more complex Ge sidewall 59 shapes in which a space may exist between the Ge sidewall 59 and liner 56. The resulting gap permits surface passivation processes such as thermal oxidation to be performed. The gap can later be filled with an additional material for the liner 56. Such an approach has the benefit of providing for simultaneous passivation of both top and side surfaces of the Ge. After CMP, the top surface of the Ge well 58 is coplanar with liner 56 deposited on top of interlayer dielectric 54, as shown in FIG. 1. After thorough cleaning, a thin screen dielectric is deposited on top of the structure which serves to protect the Ge and prevent channeling during subsequent ion implantation steps. It is also possible to access the Ge sidewall through the formation and subsequent etching of a stack of dielectric and polycrystalline silicon sidewalls. A gap produced by this method serves the same purpose to allow exposure to the semiconductor sidewall permitting a high quality passivation layer to be formed.

Most of the Ge well 58 is doped n-type and functions as part of the SPAD cathode. At the top of the Ge well 58, a p-type doped anode (which includes region 60 and region 62) is formed to extend throughout the topmost layers from the edges of the Ge well 58. A circular or near circular more heavily doped p-type region 62 is formed away from the Ge sidewall 59 or the perimeter of the Ge well 58 and has higher dose implants extending deeper into the Ge than the p-type doped region 60. The heavily doped p-type region 62 may be defined by photo lithography using conventional methods followed by ion implantation of boron. The heavily doped p-type region 62 defines a central region and the multiplication occurs in the well 58 below the region 62 rather than the peripheral volume where the electric field is lower. The ion implants may be activated by about a 20 sec rapid thermal anneal at about 600° C. after which the screen dielectric may preferably be removed and replaced by a new interface material. The thin interface layer is not shown separately in FIG. 1. An additional interlayer dielectric 64 may be deposited on top of all the other layers and regions. Interface barrier metallization 66 and tungsten plug 68 are connected to the p-type region 62 as shown in FIG. 1. The surface doping concentration in the p-type region 62 is high enough, typically above about $5 \times 10^{18}$ cm$^{-3}$, to form an ohmic contact. In other embodiments, it may be advantageous to move the contact placement onto the p-type region 60 to improve optical signal strength to the multiplication region 58 below the heavily doped p-type region 62 and form factor if the surface doping concentration is sufficient. Interface barrier metallization 70 and tungsten plug 72 are connected to the tungsten plug 50 that in turn connects to the various n+/p+ source/drain regions 26. The first metal layer is formed on top of the structure in such a way that all the topmost and exposed tungsten plugs are connected to either metallization regions 74 which connect to Si, or to metallization regions 76 which connect to the anodes 60, 62 of the Ge SPAD preferably in one step. As required by the circuitry, additional metal vias and metallization layers are typically formed, most commonly by using tungsten plugs and aluminum metal or by copper dual damascene processes.

Figure 2:
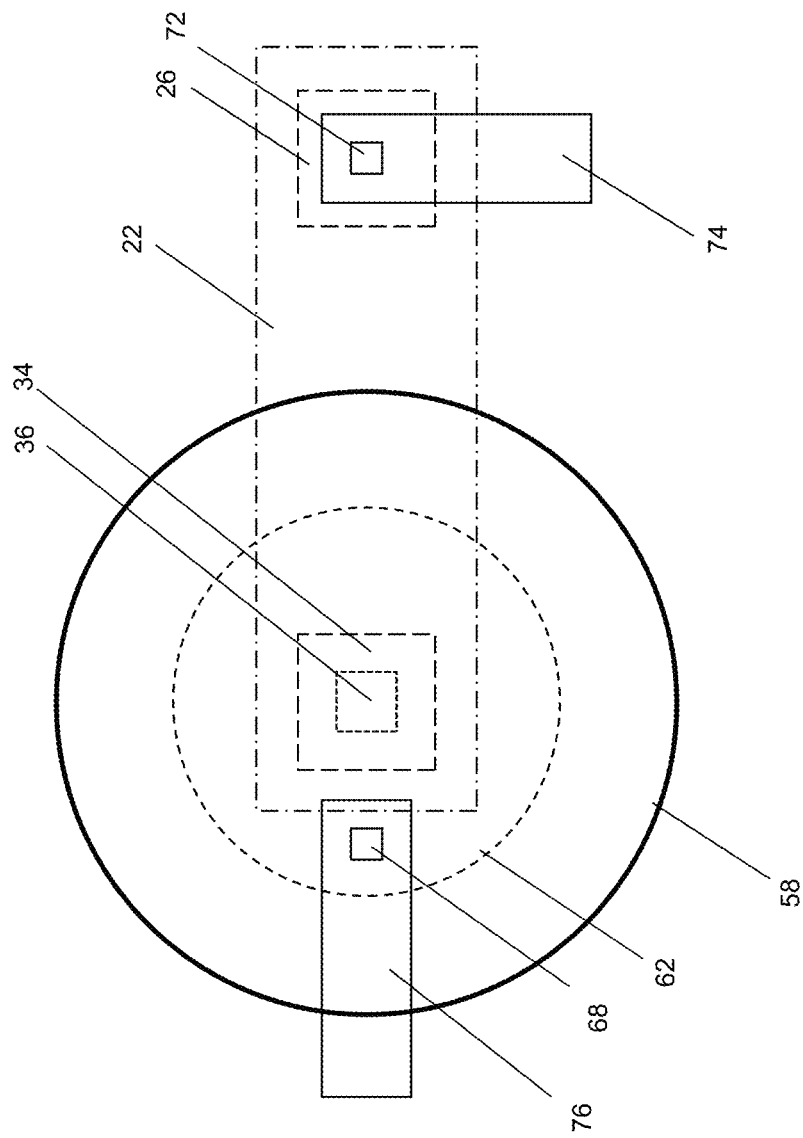
FIG. 2 is a schematic plan view of the completed SPAD device structure according to embodiments of the present invention.

To better understand the SPAD according to the embodiment of FIG. 1, a detailed view of the Ge SPAD by itself with its anode and cathode connections is provided in the top-down view of FIG. 2 where the most essential patterns have been drawn. The Ge SPAD device is fabricated in Ge well 58. The Ge well 58 can be in many different shapes, including square, octagon and circular—as exemplified in FIG. 2. A beneficial property of circular and octagonal shapes is that they adhere more closely to the epitaxially grown shape of the Ge material. This geometry minimizes Ge overgrowth and is more economical. The metal line 76 connects to the SPAD anode by tungsten plug 68. The metal line 74, connects to the SPAD cathode by a serial connection of tungsten plug 72, silicide covered n+ source/drain region 26, n-well 22, n+ region 34 and n-type doped Ge trench 36. The p-type region 62 is preferably circular to minimize electric field hot spots regardless of the shape of the Ge well 58 and is centered in the device.

Figure 3:
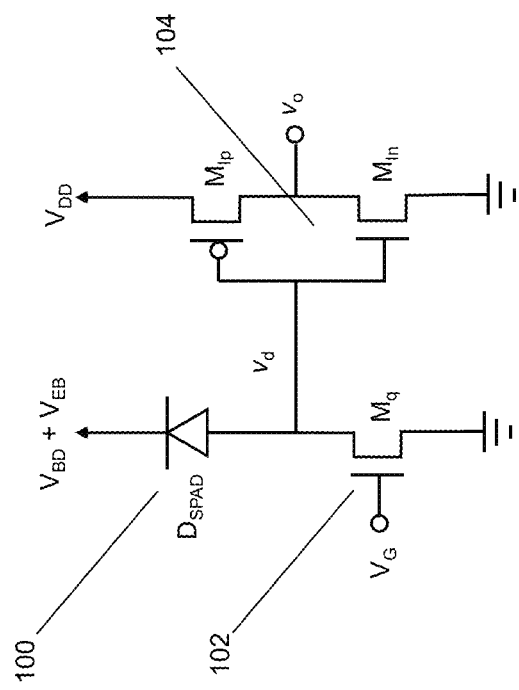
FIG. 3 is a circuit schematic showing a connection of the SPAD anode to a quench transistor and output CMOS inverter according to embodiments of the present invention.

During operation, the SPAD may be operated in Geiger-Müller (GM) mode where it is reverse biased (cathode voltage is more positive than anode voltage) beyond the breakdown voltage ($V_{BD}$) to achieve a high likelihood that single photons being absorbed in the multiplication region of the detector trigger an avalanche of electrons or holes to produce a very high current easily detected by the circuit. FIG. 3 shows the SPAD $D_{SPAD}$ 100 together with MOS transistor $M_q$ 102 acting as a quench resistance together with an output CMOS inverter 104 made from transistors $M_{In}$ and $M_{Ip}$. The quench transistor $M_q$ could be replaced with a polycrystalline silicon resistance readily available within the CMOS process if desired at the probable cost of increased total device area. The quench transistor $M_q$ 102 is biased with gate voltage $V_G$ to place it in linear mode acting as a constant resistance. The cathode of the SPAD 100 is biased with a voltage exceeding the device breakdown voltage by an amount $V_{EB}$. Before an incoming photon triggers an avalanche, the drain voltage $v_d$ of the quench transistor $M_q$ 102 is near zero and $v_o$ is held at a logic 1 state. Once an avalanche is triggered by an absorbed photon or trap generation in the depletion region of the junction, a high current flows through the SPAD until the voltage across the SPAD is reduced to the breakdown voltage. The voltage $v_d$ rises to near $V_{EB}$ changing the logic state of the inverter output $v_o$ to 0. $V_{EB}$ must be limited to less than the $V_{DD}$ permitted by the CMOS process to avoid transistor damage but must be large enough to change the logic state of the inverter. FIG. 1 shows the advantage of a "top anode" structure where the contact to the anode (region 60 and region 62) of the SPAD occurs with metal contact 76 and contact to the cathode (trench 36 and well 58) occurs through metal contact 74. With the voltage on contact 74 held constant at $V_{BD}+V_{EB}$, the capacitance created by the n-well and substrate junction does not contribute to the switching delay time of the SPAD thus increasing the device frequency response and reducing the "dead time" of the device. The small junction capacitance of the present oxide isolated device also limits the magnitude of the recharge current flow reducing the likelihood of an afterpulsing event.

Figures 4A, 4B, 4C:
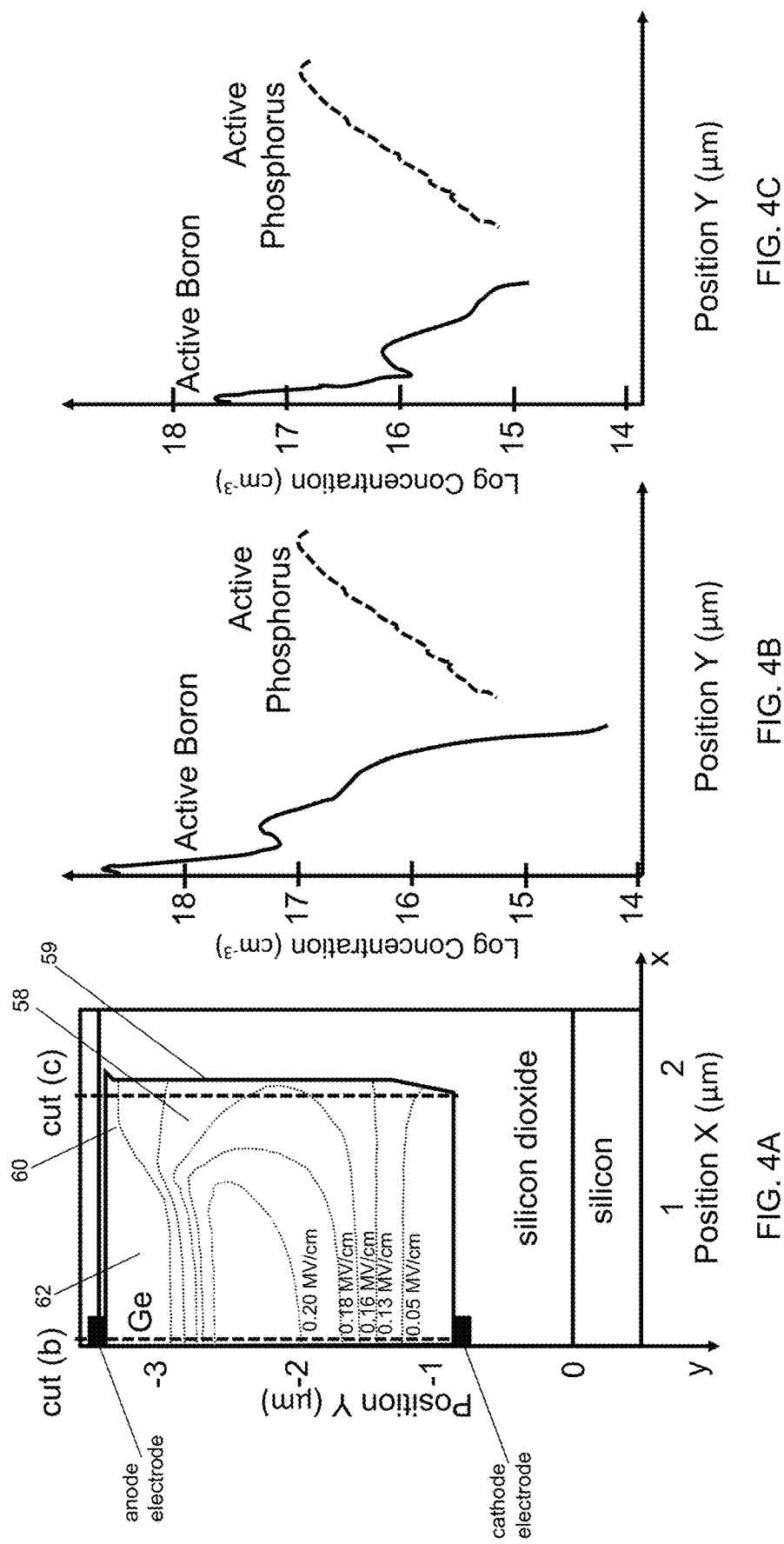
FIGS. 4A-4C show exemplary electric fields in the SPAD device at the operating point and exemplary doping profiles of the SPAD device according to embodiments of the present invention.

The operation of the SPAD according to the embodiment illustrated in FIG. 1 can further be understood by the exemplary case illustrated in FIG. 4. FIG. 4A is a simulation of the electric field at a diode reverse bias of 30.55 V which is 2 V past its breakdown voltage ($V_{BD}$) of 28.55 V. $V_{BD}$ is defined as the reverse bias at which the steady-state dark current (i.e. no illumination) in the device reaches 1 nA, a current vastly dominated by impact ionization. In FIG. 4A, only the right half of a circularly symmetric SPAD is shown, thus the x-axis (Position X) measures the radial distance from the center of the Ge well 58. The y-axis (Position Y) measures the distance from the surface of the silicon with the y-axis is pointing downwards. The example in FIG. 4A has a Ge well 58 thickness of 2.5 μm and a radius of 1.9 For the purpose of simplifying the calculation, idealized ohmic electrodes were placed near the center of the Ge well 58 at the top and bottom of the Ge, respectively. This contact simplification provides a representative view of how the electric fields develop inside the Ge well 58.

In FIG. 4A, the electric field is indicated by contour lines at which the field is constant. In the central part of the device, a high field develops which has a very wide relatively flat portion near the maximum value just exceeding 0.2 MV/cm. This field results in a high likelihood of impact ionization while staying below or near the onset of band-to-band tunneling. The electric field is developed primarily in the vertical direction. In the p-type anode 60, 62 in FIG. 1 and near the Ge sidewall 59, we see in FIG. 4A that the field is again nearly vertical but stays below the critical field strength required for impact ionization. Thus, any dark carriers generated, for example, as a result of dangling bonds at the sidewall surface of the Ge, are effectively swept to the anode and cathode without being amplified by impact ionization and thus do not contribute to the dark count rate (DCR). Near the edge of the heavily doped p-type region 62, the electric field is still primarily vertical but develops a small horizontal component as a result of the different doping profile outside the heavily doped p-type region 62. This is shown in Position-X at approximately 1.2 μm in FIG. 4A. The likelihood of initiating an avalanche decreases beyond this position-X, but the transition is gradual. Thus, it is important that there is a physical spacing of at least a few hundred nanometers between the heavily doped p-type region 62 pattern and Ge sidewall 59 in FIG. 1 so as to avoid an increase in DCR due to dark carriers generated near the Ge sidewall 59.

The electric field simulation of FIG. 4A can further be understood by considering the doping profiles near the center of the device according to cut (b) and near the edge of the device according to cut (c), which are shown in FIGS. 4B and 4C, respectively. In this exemplary SPAD, blanket phosphorus of dose $1\times10^{13}$ cm$^{-2}$ and energy 3.7 MeV was implanted through a 40 nm thick screen oxide per the above described procedure. All implants in the example were provided at 0 degrees tilt (i.e. perpendicular to the wafer surface). Blanket means the ions are implanted in all parts of the wafer without a patterned mask. The Monte-Carlo simulation after activation of the phosphorus profile is unaffected by boron implants at the surface and is identical in FIG. 4B and FIG. 4C. This implant results in a retrograde profile with a higher level of phosphorus near the bottom of the Ge well which has the advantage of providing tolerance to thickness variations and a low resistance to lateral current flow in the cathode while still enabling a relatively low doping level in most of the Ge. The profile of the p-type anode 60 is composed of two blanket boron implants. One of them has a dose of $4\times10^{12}$ cm$^{-2}$ and an energy of 20 keV. The other blanket boron implant has a dose of $5\times10^{11}$ cm$^{-2}$ and an energy of 150 keV. These boron implants are depicted in FIG. 4C. The p-type region 62 had a radius of 1.2 μm (X-position 1.2 μm in FIG. 4A). Two additional boron implants are provided in the p-type region resulting in the overall doping profile in FIG. 4B. One of them has a dose of $4.6\times10^{13}$ cm$^{-2}$ and an energy of 20 keV while the other has a dose of $6.5\times10^{12}$ cm$^{-2}$ and an energy of 150 keV. Thus, for this example the same energy of implants were selected for the p-type region 62 as for the blanket p-type region 60 which resulted in a gradual transition between the center and edge regions of the device which reduces the likelihood of high electric field hot spots.

One important aspect of the SPAD design according to this embodiment is the ability to create a higher field multiplication region near the center of the device and a lower electric field region near the edge of the device. Thus, during GM operation of the SPAD, carriers generated in most of the Ge volume in the high field multiplication region trigger an avalanche event. Thus, photon generation should primarily take place in the device center which can be aided by conventional microlens arrays on top or bottom of each SPAD. However, it is imperative that major dark current generation sites near the dielectric/Ge sidewall do not cause avalanche events. In some embodiments, this may be aided by keeping the heavily doped p-type region 62 away from the perimeter of the well 58. In FIG. 4A, it is clear that the parameters of this SPAD fulfill this criterion. At $V_{BD}$ the peak electric field in the p-type region 62 is 0.22 MV/cm whereas even at 2V in excess of $V_{BD}$, the peak field near the edge of the device is below 0.16 MV/cm. Thus, at the GM operating point, carriers generated within the multiplication region have a high likelihood of triggering an avalanche due to its vertical box-like electric field. On the other hand, the likelihood of causing impact ionization is very low near the Ge/oxide side-wall surface. Such dark carriers are still collected by the anode and cathode, but since it is not an amplified current, it remains orders-of-magnitude lower than the value needed to trigger the inverter in FIG. 3. Thus, one key parameter is selecting an optimum distance between the edge of heavily p-type doped region 62 and Ge sidewall 59. In FIG. 4A this distance is 0.7 μm which yields a low likelihood of contribution to DCR of any dark carrier generated in the depletion region encompassing the Ge/dielectric interface. The requirement for this distance depends on the acceptable DCR as well as surface passivation properties and required optical sensitivity. Keeping all the other parameters the same as in FIGS. 4A-4C, the effect of both smaller and larger distances is disclosed. Larger distances provide an even greater robustness to surface generated DCR and a smaller multiplication area also benefits some other DCR mechanisms whereas smaller distances improve the optical fill factor and tend to lower the peak electric fields slightly. Even when this distance is reduced to 0.3 um, the likelihood that a carrier generated at the dielectric sidewall triggers an avalanche is less than 2%, thus still providing a benefit. For some applications where the requirements for low DCR are less stringent or where surface conditions are already excellent, it is possible to further simplify the design. One such special case has the heavily doped p-type region 62 cover the entire surface of the Ge well 58 thereby the heavily p-type doped region 62 and p-type region 60 coincide. This special case has the advantage that the number of implants can be reduced and no patterning is needed. It also has the most uniform electric fields providing for reductions in DCR from to band-to-band tunneling.

In addition to avoiding the contribution to DCR by edge depletion region surface generated carriers, the box-like boron and retrograde phosphorus implants produce a near-ideal wide box-shaped electric field and depletion region which favors impact ionization over band-to-band tunneling.

A general benefit of the embodiment of the invention according to FIGS. 1-2 as exemplified by the particular representative examples of FIGS. 4A-4C is that it minimizes the number of patterned implants and provides for a tunable surface carrier DCR sensitivity while being robust to hot spots. To avoid hot spots near the Ge-oxide sidewall, and with process parameters according to FIGS. 4A-4C, the interface fixed charge density at the interface should be below approximately $2 \times 10^{11}$ cm$^{-2}$. The exemplary device structure provided above and its relation to FIGS. 4A-4C are only some of many variations of the invention according to the embodiment of FIG. 1.

Figure 5:
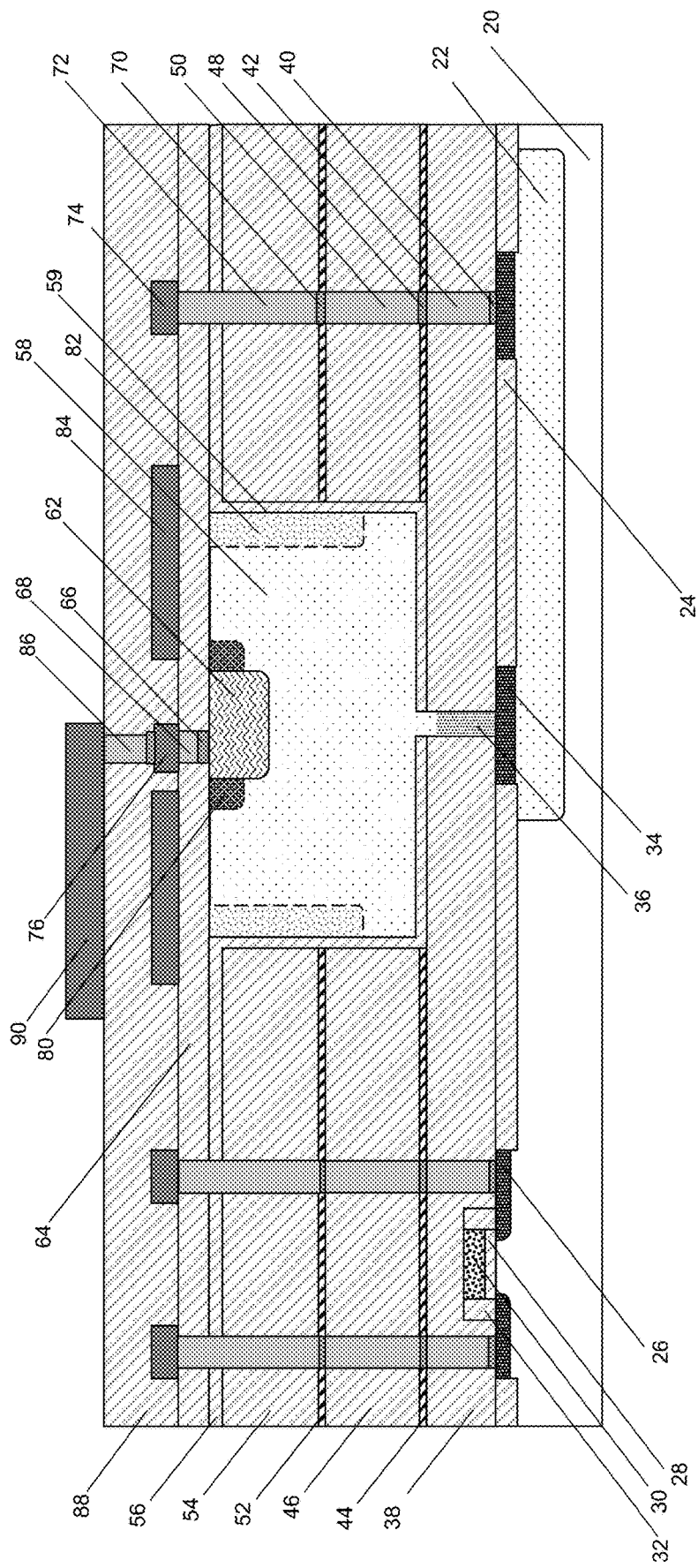
FIG. 5 is a schematic cross-sectional view of the completed SPAD device structure with a conventional MOS transistor according to embodiments of the present invention.

A second device structure embodiment is disclosed and illustrated in FIG. 5. This embodiment uses a different geometry to separate some dark carriers generated by surface traps. In this embodiment, such dark carriers are collected by a lateral electric field near the top surface providing for both physical and directional separation from the larger magnitude nearly vertical electric field in the multiplication region of the device. A gate electrode placed on top of the device, outside of the heavily p-type doped region 62, is used to provide yet additional control of the surface potential. FIG. 5 shows an embodiment which shares a majority of parts with the previous embodiment, and thus the procedure for making the SPAD according to this embodiment is the same until a suitable n-type doping is formed in Ge well 58 having a Ge sidewall 59 with nearly vertical or a more complex shape. The shape of the sidewall may depend on faceting during epitaxial growth or the particular etch process used to form the Ge well cavity 58. A circular or near circular p-type region 62 is formed away from the edges of the Ge well 58. The p-type region 62 is defined by photolithography using conventional methods followed by ion implantation of boron. One of the benefits of the device according to this embodiment is that a stronger horizontal field component exists in surface areas where a large dark current generation may be expected. The horizontal field will keep such carriers away from the multiplication region. Therefore, the p-type layer should not extend to the perimeter of the Ge well 58. To avoid electric field hot spots at the edge of the p-type region 62, a guard ring 80 larger than region 62 is formed by ion implantation of boron. This type of guard ring is fully analogous to many implementations of such guard rings in other prior art lateral SPAD designs. Since the guard ring 80 extends laterally beyond the p-type region 62, and since the cathode extends throughout the entire bottom of Ge well 58, such a design results in a lateral component to the electric field near the edge of said guard ring 80.

In cases where the interface charge is negative along the Ge sidewall 59 or where additional design margin is desired for other reasons, it may be beneficial to increase the n-type doping concentration along the Ge sidewall 59. One way to accomplish this is to make an additional patterning step by photo-lithography and implanting phosphorus along the entire perimeter of the device so that the perimeter of the SPAD is connected to the cathode. This forms a perimeter cathode 82 which prevents depletion of Ge sidewall 59. The perimeter cathode 82 could alternatively be formed by positive interface charges applied on Ge sidewall 59. It is critical to maintain sufficiently low doping and a large enough spacing between the perimeter cathode 82 and guard ring 80 so that the electric field in this region is well below that necessary to cause impact ionization.

Rapid thermal annealing and formation of the additional interlayer dielectric 64 proceeds as before and interface barrier 66 and 68 make contact to the p-type region 62. As before, the first layer metallization makes connection to both the Ge anode and Si regions simultaneously. An additional metal pattern may also be formed in the same step forming Ge gate 84. Annular ring Ge gate 84 typically covers at least one of the edges of the guard ring 80 and/or perimeter cathode 82. The optimum bias on the Ge gate 84 depends on the particular implanted and background doping concentrations, interface charge, and trap densities. In one special case, it could be connected to the anode bias, however in all other cases it is necessary to use a second metallization level to access the Ge anode without breaking the symmetry of the annular shaped Ge gate 84. This connection is illustrated in FIG. 5 by means of via 86 which is etched in dielectric 88. The second level metal 90 as well as dielectric 88 and via 86 are all formed by methods commonly available in the standard CMOS process.

Figure 6:
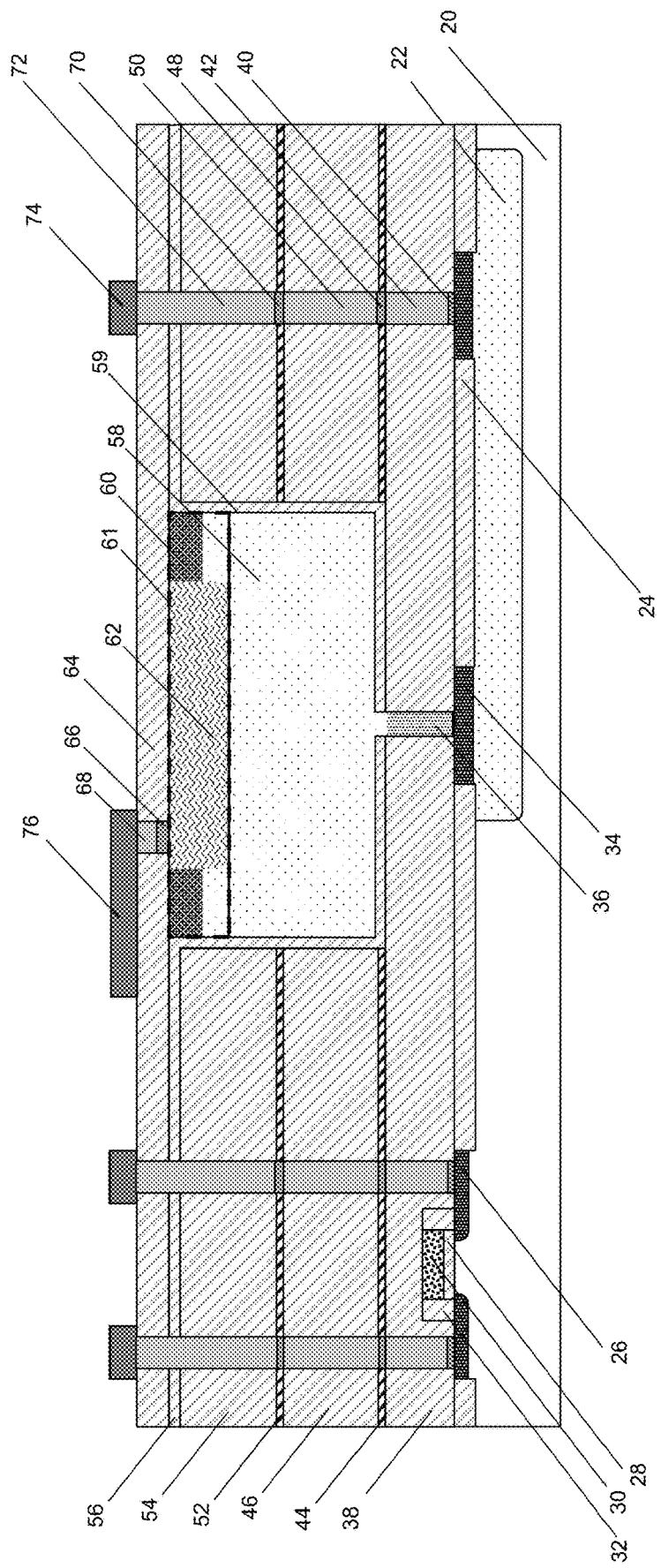
FIG. 6 is a schematic cross-sectional view of the completed SPAD device structure with a conventional MOS transistor according to embodiments of the present invention.

FIG. 6 discloses a third embodiment using a heterostructure to form the SPAD with a small bandgap material acting as the absorption region and a larger bandgap material serving as the multiplication region. The elements of this embodiment are identical to the first embodiment with the exception of the anode region which is composed of a small bandgap material to capture photons at longer wavelengths into the SWIR, MWIR and LWIR spectral regions. The misfit dislocation free volume 58 is formed as before, but after CMP and surface cleaning epitaxial layer 61 is grown upon it. This epitaxial material may have a different lattice constant to the material 58 thus the critical thickness for defect free growth must not be exceeded to avoid misfit dislocations. For the case of $Ge_{0.92}Sn_{0.08}$ on Ge, this critical thickness is about 140 nm and for $Ge_{0.98}Sn_{0.02}$ it is about 3.6 μm. A layer composed of $Ge_{0.98}Sn_{0.02}$ with a thickness of 3.6 μm absorbs 95 percent of the incident radiation at 1540 nm making it extremely suitable for eye safe LiDAR applications. Higher Sn mole fraction material absorbs radiation at longer wavelengths making it useful for MWIR and LWIR systems.

Figure 7:
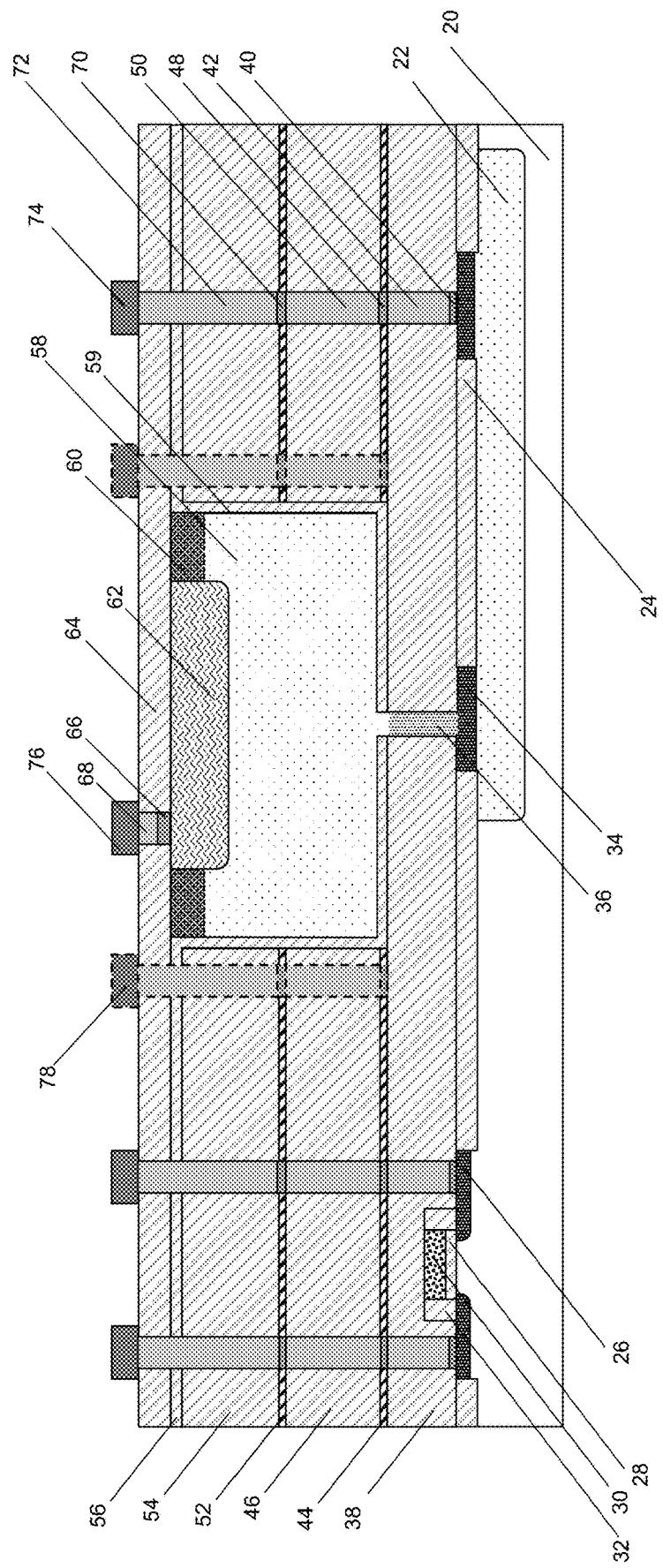
FIG. 7 is a cross-sectional view of the completed SPAD device structure with the semiconductor region surrounded by metal vias to inhibit optical cross-talk according to embodiments of the present invention.
Figure 8:
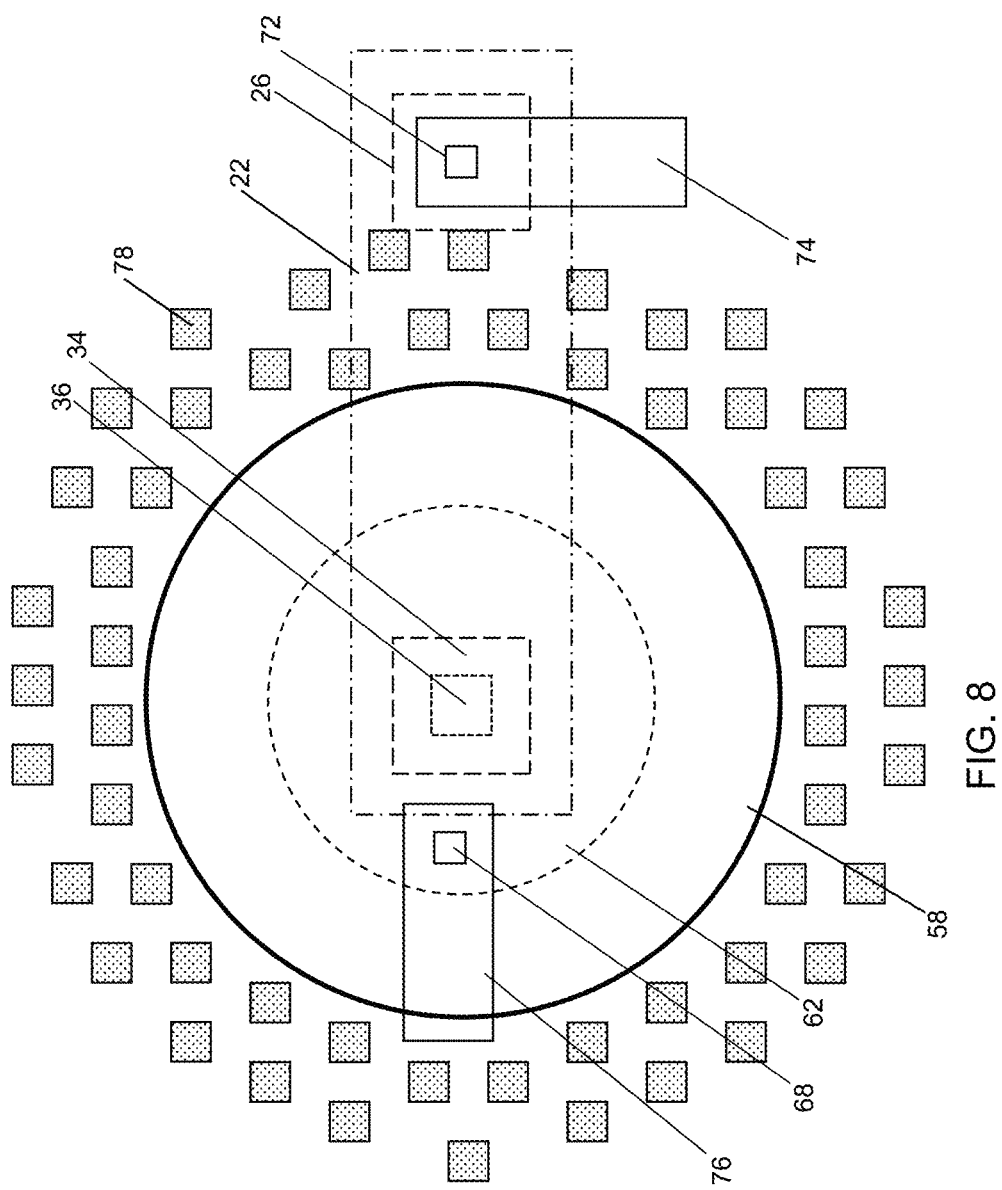
FIG. 8 is a top view of the completed SPAD device structure with the metal vias to inhibit optical cross-talk according to embodiments of the present invention.

FIG. 7 discloses a fourth embodiment using opaque structures to surround the SPAD device to block photons from entering or exiting the pixel structure. Erroneous triggering of the SPAD device may occur when a photon is created in a neighboring pixel through a recombination event via a direct transition between the conduction and valence bands. Without a blocking layer, the produced photon may traverse through the transparent dielectric isolation regions and initiate an avalanche multiplication creating unwanted cross-talk between pixels. To alleviate this problem, photon blocking elements 78 illustrated in FIG. 7 are placed at the periphery of Ge region 58 and are capable of absorbing or reflecting internally generated photons thereby reducing transmission from one detector region to the next. Element 78 is also capable of repelling external photons generated or scattered by other parts of the system such as the lens or the chip package. Element 78 may be fabricated using the existing modules of the CMOS process such as tungsten plug or copper damascene metal interconnect. FIG. 7 only shows a one metal process, but it should be understood that the light blocking structure can also be extended and continued through an arbitrary number of metal and interconnect levels. Alternatively, a deep trench may be formed around Ge region 58 composed of material opaque to radiation from the ultraviolet to longwave infrared wavelengths. FIG. 8 shows a plan view of the layout with the features labeled as previously discussed. The photon blocking elements 78 are arranged around the periphery of region 58 as could easily be accomplished using the CMOS process' metal interconnect modules (tungsten plug or copper damascene). FIG. 8 shows the blocking elements arranged in a circular fashion, but they could also be arranged with other geometries such as a square, rectangle or other suitable geometry.

Figure 9B:
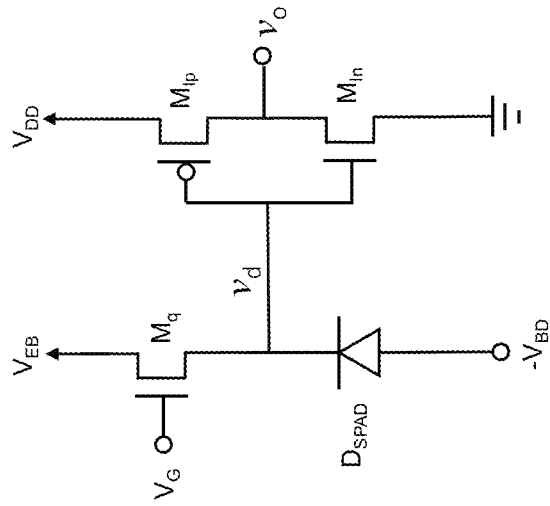
FIGS. 9A and 9B are circuit schematics showing biasing methods to connect the SPAD cathode to a quench transistor and output CMOS inverter according to embodiments of the present invention.
Figure 9A:
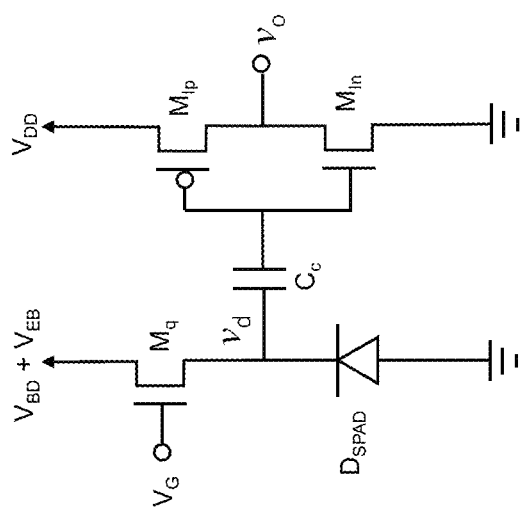

Also, although a top anode contact structure was disclosed in all the embodiments, a top cathode structure is also possible by reversing polarities of the described regions. In this case the n-well is replaced with a p-well surrounded by n-well and deep n-well regions using CMOS techniques well known to those practicing the art. FIGS. 9A and 9B show circuit schematics of the quench transistor and output inverter in this case. The quench transistor is connected to the cathode with operation proceeding as described above. To ensure the input voltage to the CMOS inverter does not exceed the $V_{DD}$ permitted by the CMOS process, the biasing scheme or schematic must change to ensure that voltages far exceeding $V_{DD}$ do not reach the input of the inverter. In FIG. 9A, a coupling capacitor $C_c$ is inserted between the SPAD cathode and the inverter input to protect the transistors while in FIG. 9B the drain voltage on $M_q$ is reduced to $V_{EB}$ ($V_{EB} \leq V_{DD}$) and $-V_{BD}$ appears on the SPAD anode. Both methods will protect the CMOS transistors and allow the polarities of the SPAD device regions to be switched.

The claimed SPAD device may also be operated in a backside illuminated mode as the sensor bond pads may be brought to the die backside by through-wafer-vias or the device array and circuitry can be direct bonded to another CMOS wafer. Since the silicon substrate 20 absorbs light with wavelengths below about 1100 nm, radiation with wavelength less than 1100 nm can be detected by substantially removing the silicon substrate 20. Techniques to remove the substrate are ubiquitous and used routinely to produce CMOS image sensors for high volume applications. However, if the intention is to detect infrared light with wavelengths exceeding 1100 nm as with some LiDAR applications, the substrate need not be removed. However, it may be advantageous to thin the substrate so as to allow a microlens to be closer to the absorbing region. To improve quantum efficiency for backside illumination, a reflective material such as aluminum or copper used for metal 1 in a CMOS process may be placed on top of the device to reflect radiation back into the absorbing region of the SPAD, and an anti-reflection coating (ARC) is preferably placed on the back-side illuminated silicon surface.

Although embodiments are described above with respect to a specific material, e.g., germanium, it should be realized that materials other than germanium may also be used. For example, alloys of silicon germanium, and tin could be used as well ($Si_{1-x}Ge_x$, $Si_{1-x-y}Ge_xSn_y$, or $Ge_{1-x}Sn_x$) where x and y may take values between zero and unity with the sum of all constituents adding to 100 percent. Because the bandgaps of these materials are a function of the mole fraction of the constituent elements, there will be a trade-off between the cutoff wavelength and the ultimate dark current. For the example of $Si_{1-x}Ge_x$, as the Ge fraction x is decreased, the dark current becomes lower and the cutoff wavelength also becomes smaller. Also, other semiconductor materials, such as InGaAs, HgCdTe, and InSb, may also be used for the nearly defect free region on the silicon substrate or an epitaxial layer on the defect free region. Although a SPAD device is described, the device does not need to be biased into breakdown to be useful for imaging. A device biased in a way to convert incoming photons to an electrical current to be collected and analyzed to form an image is also useful.

The invention claimed is:

1. A single photon avalanche detector (SPAD) device configured to detect visible to infrared light, the device comprising:
   a substrate;
   a trench coupled to the substrate, having a lattice mismatch with the substrate, and having a height equal to or greater than its width; and
   a substantially defect-free semiconductor region comprising photosensitive material, the semiconductor region comprising:
      a well coupled to the trench and doped a first type, the well configured to detect a photon and generate a current; and
      a region formed in the well and doped a second type opposite to the first type,
      wherein the well is configured to cause an avalanche multiplication of the current, and
      wherein the trench and the well form a first electrode and the region forms a second electrode.

2. The device of claim 1, wherein the first type is n-type and the second type is p-type.

3. The device of claim 2, wherein the substrate is a p-type silicon substrate and includes an n-well region formed in the substrate, and wherein the trench is coupled to the n-well region.

4. The device of claim 3, wherein the trench is formed on an n+ source/drain region contained within the n-well region.

5. The device of claim 2, wherein the substrate is an n-type substrate.

6. The device of claim 1, wherein the height of the trench is at least 1.7 times the width of the trench.

7. The device of claim 6, wherein dislocations in the trench propagate to a side wall of the trench.

8. The device of claim 1, wherein the semiconductor region has a band gap between about 0.08 eV and about 2.0 eV.

9. The device of claim 1, wherein the semiconductor region has a band gap between about 0.08 eV and about 0.9 eV.

10. The device of claim 1, wherein the well and the trench comprise germanium.

11. The device of claim 10, wherein the well and trench comprise a germanium tin alloy.

12. The device of claim 1, wherein the trench is epitaxially grown on the substrate and the lattice mismatch with the substrate is greater than about 0.2%.

13. The device of claim 1, further comprising one or more dielectric layers formed adjacent to the semiconductor region and configured to allow a height of the well to be increased.

14. The device of claim 1, further comprising an oxide sidewall along the semiconductor region wherein the oxide sidewall has an interface trap density below about $2 \times 10^{11}$ $eV^{-1}$ $cm^{-2}$ and a fixed charge density below about $2 \times 10^{11}$ $cm^{-2}$.

15. The device of claim 1, wherein the well is configured to detect the photon having a wavelength between about 300 nm and about 15,000 nm.

16. The device of claim 1, wherein the well is configured to detect the photon having a wavelength between about 900 nm and about 15,000 nm.

17. The device of claim 1, wherein the region has a perimeter equal to or less than a perimeter of the well.

18. The device of claim 17, further comprising a guard ring spaced radially away from the perimeter of the region, the guard ring configured to modify an electric field profile outside the perimeter of the region.

19. The device of claim 1, wherein the region comprises an alloy comprising germanium, wherein the alloy is $Si_{1-x}Ge_x$, $Si_{1-x-y}Ge_xSn_y$, or $Ge_{1-x}Sn_x$.

20. The device of claim 1, further comprising a plurality of opaque structures disposed around a perimeter of the semiconductor region, the opaque structures configured to block photons from entering or exiting the device.

* * * * *